United States Patent [19]
Dube et al.

[11] Patent Number: 4,807,970
[45] Date of Patent: Feb. 28, 1989

[54] HOLOGRAMS IN PHOTOREFRACTIVE MATERIALS

[75] Inventors: Roger R. Dube, Carmel, N.Y.; Shingshwang Yao, Tucson, Ariz.

[73] Assignee: International Business Machines Corporation, Armonk, N.Y.

[21] Appl. No.: 124,215

[22] Filed: Nov. 23, 1987

[51] Int. Cl.$^4$ .......................... G03H 1/02; G03H 1/04
[52] U.S. Cl. .................................... 350/3.64; 350/320
[58] Field of Search .............................. 350/3.64, 320

[56] References Cited

U.S. PATENT DOCUMENTS 4,674,824 6/1987 Goodman et al. .................. 350/3.64

OTHER PUBLICATIONS

Peltier et al, "Volume Hologram Recording and Charge Transfer Process in $Bi_{12}SiO_{20}$ and $Bi_{12}GeO_{20}$", Journal of Applied Physics, vol. 48, No. 9, Sep. 1977, pp. 3683-3690.

Huignard et al, "Wave Mixing in Photorefractive Bismuth Silicon Oxide Crystals and its Applications", Optical Engineering, vol. 24, No. 4, Jul./Aug. 1985, pp. 586-592.

Stepanov et al, "Efficient Degenerate Four-Wave Mixing in a Photorefractive Cubic $Bi_{12}TiO_{20}$ Crystal", Sov. Phys. Tech. Phys., vol. 29, No. 6, Jun. 1984, pp. 703-705.

Stepanov et al, "Efficient Unstationary Holographic Recording in Photorefractive Crystals under an External Alternating Electric Field", Optics Communications, vol. 53, No. 5, Apr. 1, 1985, pp. 292-295.

A. Marrakchi et al, "Application of Phase Conjugation in $Bi_{12}SiO_{20}$ Crystals to Mode Pattern Visualization of Diffuse Vibrating Structures", Optics Communications, vol. 34, No. 1, Jul. 1980, pp. 15-18.

J. P. Huignard et al, "Time Average Holographic Interferometry with Photoconductive Electrooptic $Bi_2SiO_{20}$ Crystals", Applied Optics, vol. 16, No. 11, Nov. 1977, pp. 2796-2798.

H. M. Smith, Holographic Recording Materials, Springer-Verlag, vol. 20, 1977, pp. 101-132, Chapter 4 by D. L. Staebler.

Primary Examiner—John K. Corbin
Assistant Examiner—David J. Edmondson
Attorney, Agent, or Firm—H. F. Somermeyer

[57] ABSTRACT

The holographic diffraction efficiencies of photorefractive or electro-optic crystals, such as bismuth silicon oxide (BSO), increase while experiencing high AC voltages. The diffraction efficiency also increases with frequency of the AC voltages up to a saturation frequency. These enhancements are attributed to the response times of the crystal and the superposition of internal electric fields. The enhanced diffraction efficiency assists in retentively recording information bearing holograms in electro-optic crystalline media.

10 Claims, 3 Drawing Sheets

HOLOGRAMS IN PHOTOREFRACTIVE MATERIALS

FIELD OF THE INVENTION

The present invention relates to volume holograms stored in photorefractive materials, more particularly to method, apparatus and articles relating to enhancing the diffraction efficiency during inducement or generation of a volume hologram in such photorefractive materials.

DISCUSSION OF PRIOR ART

It is known that volume holograms can be induced in photorefractive materials. Peltier et al. in "Volume Hologram Recording and Charge Transfer Process in $Bi_{12}SiO_{20}$ and $Bi_{12}GeO_{20}$", JOURNAL OF APPLIED PHYSICS; Vol. 48, No. 9, Sept. 1977, pp. 3683–3690, describe hologram formation and erasure in photorefractive crystals. Peltier et al. teach that such hologram formation is achievable using a DC electric bias field with a field strength of 6 KV/cm. Such hologram formation also relates to phase conjugation optics.

Huignard et al. "Wave Mixing in Photorefractive Bismuth Silicon Oxide Crystals and its Applications"; OPTICAL ENGINEERING, Aug. 1985, Vol. 24 No. 4, pp. 586–592 illustrate various techniques for two-wave mixing within photorefractive crystals for hologram formation; again a DC electric bias field is used for facilitating the hologram formation.

Staebler, in Chapter 4 of the book HOLOGRAPHIC RECORDING MATERIALS, Vol. 20 of the series "Topics in Applied Physics", published by Springer-Verlag, 1977, pp. 101–132 sets forth a tutorial on such hologram formation. Staebler also refers to a DC bias field in Section 4.1.4 of Chapter 4. Staebler teaches that diffraction efficiency (DE) of a given hologram can be enhanced with an electrical bias field.

Stepanov et al. in an article entitled "Efficient Unstationary Holographic Recording in Photorefractive Crystals Under an External Alternating Electric Field"; OPTICS COMMUNICATIONS, Vol. 53, No. 5, April 1985, pp. 292–295, substitute an alternating bias electric field for the stationary or direct current DC fields referred to above. Stepanov et al. employed two beams for generating the volume hologram in a photorefractive material. The ratio of light intensities of the two beams (in the article and hereinafter referred to as pattern contrast factor "M") is much less than 1. This ratio indicates that one of the light intensities is much larger than the light intensities of another beam. Such ratios of light intensities are useful for phase conjugation applications. Stepanov et al. show that for such a low contrast ratio M, that the angle between the two beams forming the hologram, also termed spatial frequency, can be optimized for given parameters of the photorefractive crystal. Stepanov et al. report that a step-like AC field is more efficient than a sinusoidal shaped AC field. Stepanov et al. also reports that the sensitivity of the recording procedure is not increased, but that the stationary hologram amplitude for a given initially low contrast M being much less than 1 is increased. Stepanov et al. teach that the time period of the AC bias, for the value of M being much less than 1, is independent of the light intensity, electric field amplitude and local variations of the crystal parameters. According to Stepanov et al., the above statement is true only when the time period of the bias field is much greater than the average lifetime of a photoelectron and is much less than the characteristic time of hologram build-up. It is believed that the value of M used by Stepanov et al. was not greater than 0.0001 (ratios 1:10,000 or greater).

Based upon the above-cited references, it can be said that diffraction efficiency of a photorefractive crystal is related to the space-charge field created by the two or more interfering light beams. This space-charge field is dependent upon the amount of filling carriers in the traps within the crystal material. When the traps are completely filled, the diffraction efficiency is maximum. When the traps are partially filled, an external DC or AC electric field can increase the filling of traps and the diffraction efficiency. When the contrast ratio M is much less than one, it is believed that such enhancement is due to the increased trapping of carriers and a larger space-charge field under the applied external electric field.

It is desired, to maximize diffraction efficiency when forming holograms in photorefractive materials. It is also desired to store information bearing signals in photorefractive materials. Such storage requires "fixing" of the hologram as opposed to non-stationary recording as used by Stepanov et al. as a part of phase conjugation optics.

For data storage, it is desired to have the factor M close to unity. This selection enables maximizing the sensitivity of the photorefractive material for more efficiently generating hologram carrying information within the photorefractive material. It is also desired to minimize the amplitude of the bias electric field for reducing cost and increasing safety factors. As used herein, diffraction efficiency is the diffracted light intensity divided by the incident read-out intensity of the volume hologram.

SUMMARY OF THE INVENTION

It is an object of the invention to provide methods and apparatus and an improved article relating to hologram storage in photorefractive materials.

It is another object of the invention to maximize sensitivity of photorefractive materials by selecting an electric AC bias field having an amplitude and intensity-ratio M which maximizes diffraction efficiency.

In accordance with the invention, the diffraction efficiency of a photorefractive crystal is maximized in the presence of a low frequency AC field by having a low beam intensity contrast ratio M which is large (i.e. close to unity) and a predetermined amplitude of the electric AC bias field.

The foregoing and other objects, features, and advantages of the invention will be apparent from the following more particular description of preferred embodiments of the invention, as illustrated in the accompanying drawings.

DESCRIPTION OF THE ILLUSTRATIVE EMBODIMENTS

Figure 1:
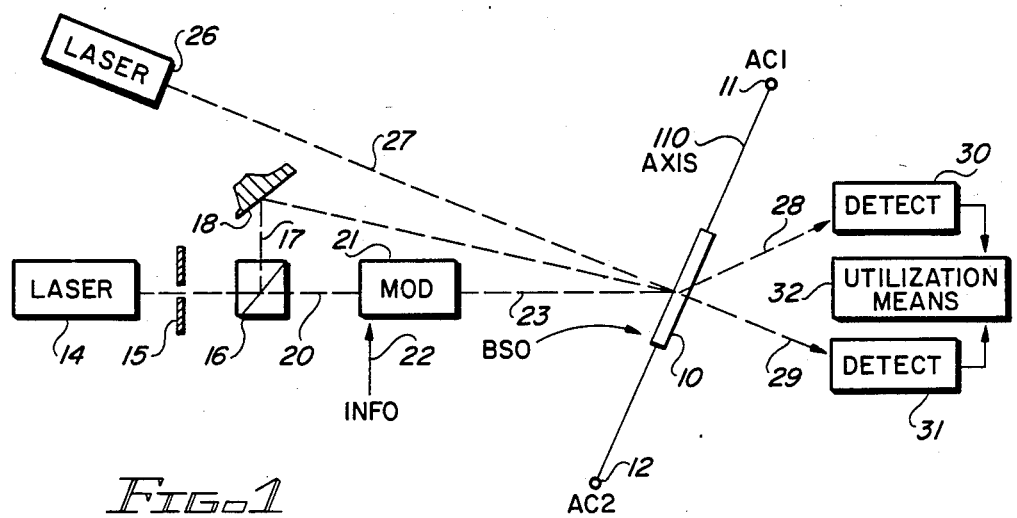
FIG. 1 is a diagrammatic showing of apparatus employing the present invention.
Figure 2:
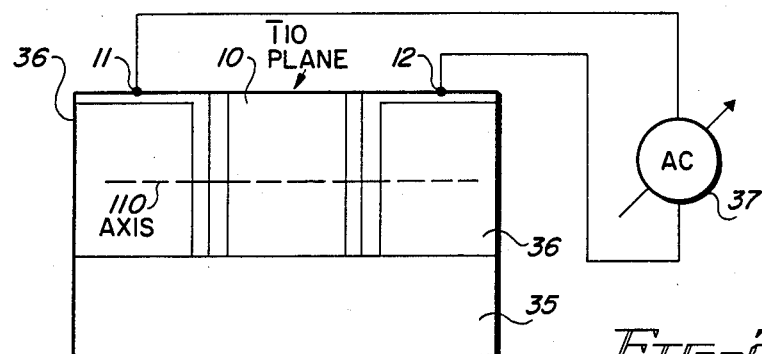
FIG. 2 is a diagrammatic expanded showing of bias field generation in a photorefractive crystal used in the FIG. 1-illustrated apparatus.
Figure 3:
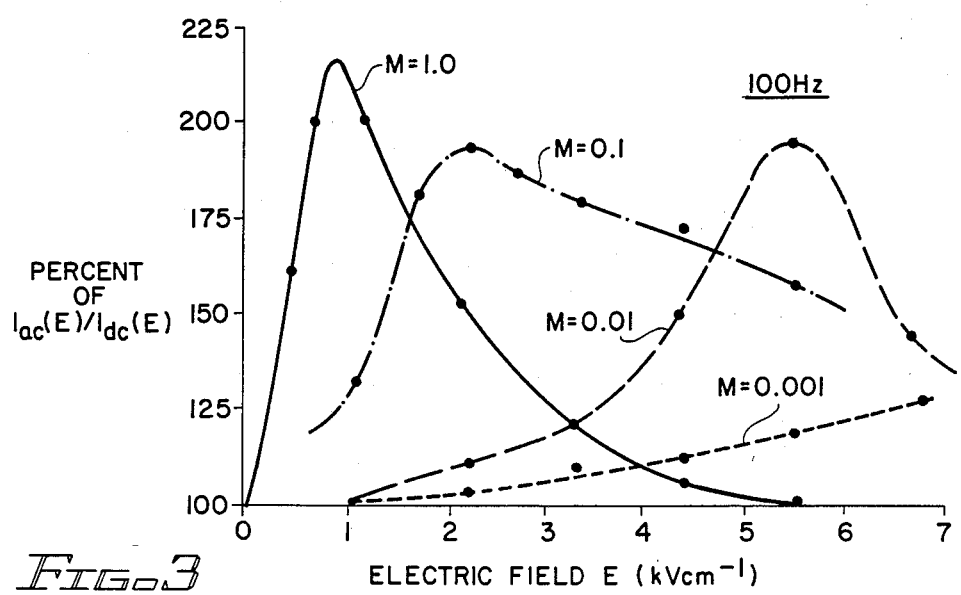

FIG. 3 graphically illustrates relationship of electric field intensity to light intensity contrast as useable with the FIG. 1-illustrated apparatus.

Figure 4:
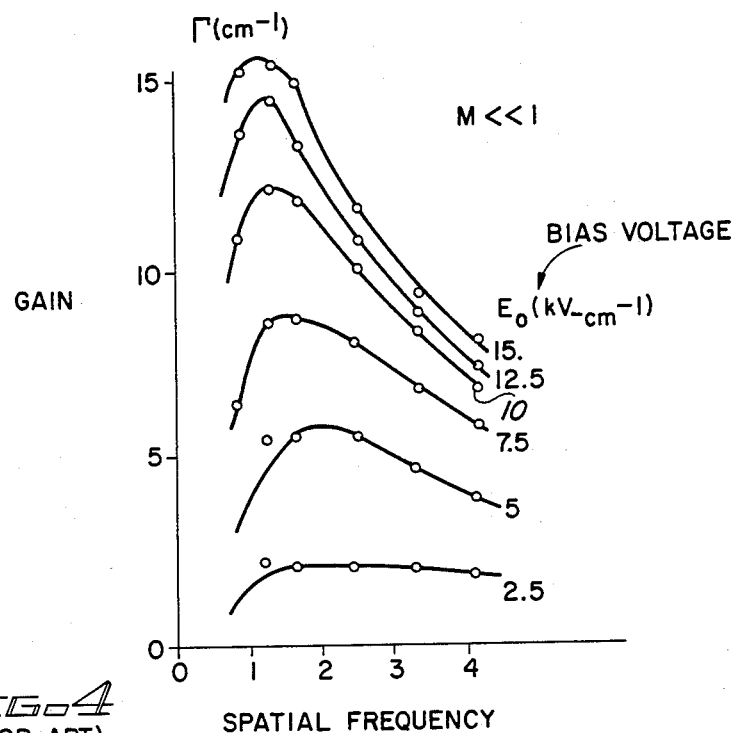

FIG. 4 is a graph illustrating the relationship of spatial frequency, bias voltage and gain, as taught in the prior art.

Figure 5:
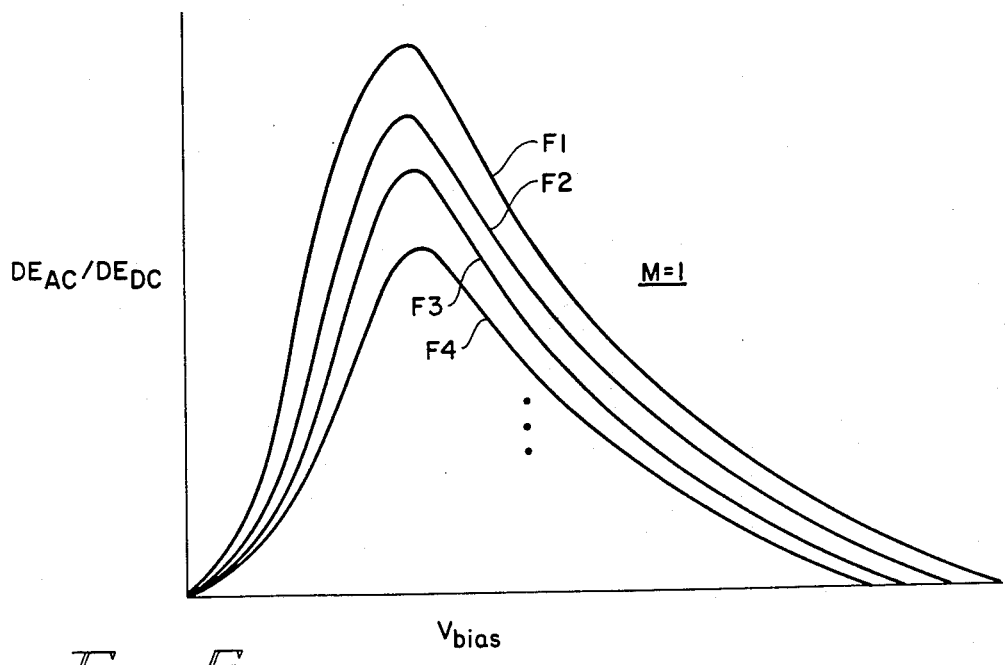

FIG. 5 graphically illustrates the relationship of bias frequency to enhancement of diffraction efficiency for an M value of unity.

Figure 6:
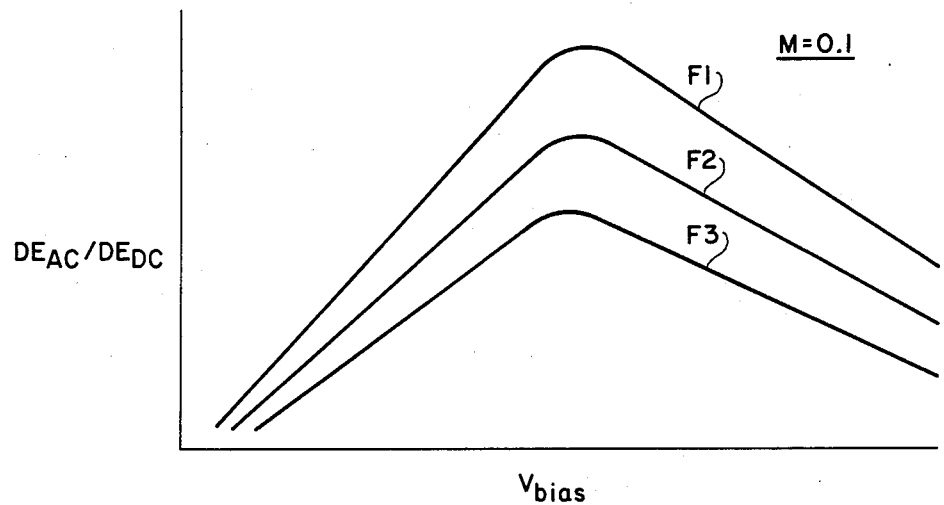

FIG. 6 graphically illustrates the relationship of frequency to enhancement of diffraction efficiency for a contrast ratio M of 0.1.

Figure 7:
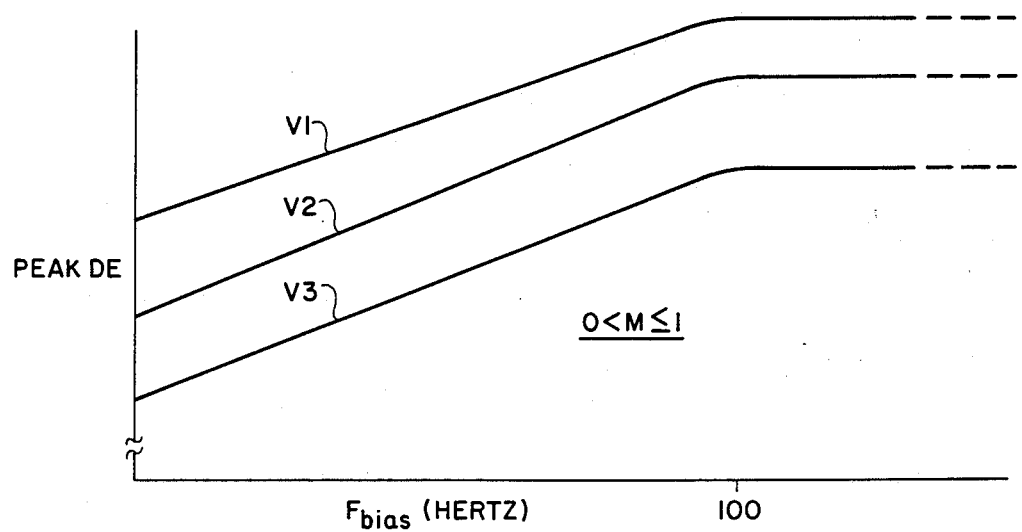

FIG. 7 graphically illustrates the relationship of maximum diffraction efficiency as a function of electric field intensity and bias frequency.

DETAILED DESCRIPTION OF DRAWINGS

Referring now more particularly to the drawing, like numerals indicate like pars and structural features in the various diagrams. A bismuth silicon oxide (BSO) photorefractive crystal 10 stores multiple volume holograms. An electric bias field is applied through the crystal 10 along its 110 axis through electric terminals 11 and 12. It is preferred that the frequency of the bias field be not greater than 100 Hertz. An argon laser 14 emits monochromatic light at about 5145 Angstroms. A mask 15 acts as a spatial filter for the laser 14 emitted monochromatic light beam. Beam splitter 16 splits the laser 14 beam into two component parts of equal light intensities. The first light beam 17 leaves splitter 16 to be reflected by mirror 18 to the light receiving surface of photorefractive crystal 10. Beam 17 constitutes a reference path for inducing holographic storage in crystal 10. The second light beam becomes the information carrying light beam through modulation by light modulator 21, as controlled by information bearing signal supplied to it over line 22.

The output light of modulator 21 travelling over path 23 to crystal is mixed with the reference light of beam 17 within crystal 10 to form a hologram. When phase conjugation is to be employed, the light intensity of beam 20 is much less than the beam intensity of beam 17, i.e. would have a low value of M (0.0001 or less). For data recording, the light intensities are equal; the contrast ratio M is equal to unity.

Gallium arsenide solid state laser diode 26 emits a hologram probing beam 27 to the light receiving surface of BSO crystal 10. The probe beam travels through crystal 10 for sensing the stored hologram. Transmitted light beam 29 leaves crystal 10 to impinge upon data detector 31. The light beams 17 and 23 also travel through crystal 10 resulting in light beam 28 impinging upon detector 30. The output signals of detectors 30 and 31 are applied to utilization means 32 for measuring the diffraction efficiency of BSO crystal 10. For data storage apparatus the output of detector 30 represents a nondestructive read-out of the hologram stored information.

BSO crystal 10 is suitably affixed to a non-transparent substrate 35 and mounted between a pair of electrically insulating support blocks 36. Terminals 11 and 12 are suitably formed on the insulator blocks 36 for inducing an electric field along the 110 axis of crystal 10. The bias receiving surface is the $\overline{1}10$ plane. The variable frequency bias signal 37 is connected to the terminals 11 and 12, also denominated as AC1 and AC2, for generating data enabling the construction of the graphs set forth in FIG. 3, et seq.

The Gallium arsenide laser emitted probe beam has a wave length of 8200 Angstroms. The reference and modulated beams 17 and 23 are separated by about six degrees, i.e. have a spatial frequency representing six degrees. Probe beam 27 is set at a Bragg angle of about 4.8 degrees from the bisector of the two write beams. In tests, such an arrangement generated approximately a five micrometer separation between fringes, with a spatial frequency of $1.3 \times 10^4$ cm$^{-1}$. Diffraction efficiency was observed to be maximized at this spatial frequency. The polarization of the writing and probe beams were perpendicular to the face of the drawing. The diffracted beam 28 was detected by a solid state silicon photo diode and analyzed on a suitable oscilloscope. The BSO crystal has a thickness of about 3.5 mm., with the front surface of about 4.5 and 13.5 mm. Switching time of the bias electric field was about 0.5 milliseconds with peak intensities indicated in the graphs. The write beams illuminated the entire 4.5 mm. width of the BSO crystal 10. The energy of the probe beam was about two milliwatts, with an area of about one square centimeter.

During testing of the invention, each transition from one polarity of the electric bias field to the other there was a sharp break in diffraction intensity. The mean diffracted intensity changed with switching frequencies, such as shown in FIGS. 5 and 6.

FIG. 3 illustrates a relationship and variation of maximizing diffraction efficiency at 100 Hertz for various contrast ratios M and electric field intensities. Varying the intensities of the write beams, decreasing the intensity of the probe beam could equalize rise times within the BSO crystal 10. Asymmetry could improve the efficiency of the crystal in response to the AC bias electric field.

Examination of FIG. 3 shows that for a contrast ratio of unity (M=1.0) a 1 kilovolt per centimeter bias field optimizes the sensitivity of crystal 10. The vertical ordinate indicates the ratio of diffraction efficiency caused by the AC field with respect to a DC field having the same amplitude. Similarly, the other curves show varying values of contrast ratios and the changes in optimum electric field for the differing contrast ratios. Finally, it should be noted, for a high contrast ratio of 0.001, or more (closer to unity), ratios of 1:1000 or less the optimum electric field for maximizing sensitivity of the crystal for maximizing diffraction efficiency was not reached because the required electric field intensity exceeded the breakdown voltage of the crystal. Therefore, at the low contrast ratios, (0.0001 or less) such as used by Stepanov et al. could not maximize sensitivity of a photorefractive crystal unless the voltage breakdown was greatly increased. Therefore, the teaching of Stepanov et al. is not applicable to maximizing sensitivity of a photorefractive crystal at reasonable electric field amplitudes.

FIG. 4 is taken from the Stepanov et al. article which shows variation of gain in a crystal by increasing bias field intensity. Note that the variation is based upon the angle between the writing beams, i.e., spatial frequency; not the bias frequency.

FIGS. 5 and 6 show variations of increases in diffraction efficiency as a function of frequency and contrast ratios wherein the frequencies are less than the 100 Hertz, as shown in FIG. 3. The vertical ordinate again is a ratio of diffraction efficiency in accordance with an AC field divided by the diffraction efficiency as measured with a DC bias field. The frequency variation maximized at 100 Hertz which is represented in the two figures by F1, with F2 through F4 indicating lower bias frequencies.

It was observed, as shown in FIG. 7, that at about 100 Hertz (voltages represented by V1-V3), that saturation was obtained. Therefore, for various photorefractive crystal there is a maximal ideal bias frequency. For the tested BSO crystal, this ideal frequency was 100 Hertz. Such saturation is a function of the M contrast value for obtaining different maximum diffraction efficiency values. In selecting such maximum diffraction efficiencies, the other parameters, as set forth in Staebler, supra should also be considered.

While the invention has been particularly shown and described with reference to its preferred embodiments thereof, it will be understood by those skilled in the art that various changes in form and details may be made therein without departing from the spirit and scope of the invention.

What is claimed is:

1. In a method of optically activating a photorefractive crystal medium having a 110 axis;
the steps of:
   subjecting the medium to an alternating polarity bias electric field along its 110 axis having a frequency of not greater than about one-hundred Hertz;
   shining two beams of monochromatic light on the medium so that impingement of the two beams on the medium is transverse to the 110 axis;
   maintaining the intensities of the two light beams to be within a ratio of less than 1000 to 1 in relative light intensities;
   modulating one of the light beam intensities with information to be inserted into the medium in volume holographic form by interaction of the two light beams within the medium; and
   maintaining the bias electric field such that diffraction efficiency is maximized at the bias frequency and said intensity ratio.

2. In the method set forth in claim 1, in said maintaining step;
   maintaining the intensity ratios of the light beams to be about one to one.

3. In the method set forth in claim 1, further including the step of:
   selecting said photorefractive crystal to be bismuth silicon oxide.

4. A hologram containing article having a hologram induced by the steps set forth in claim 1.

5. In a method of retentively photoinducing a hologram into a photorefractive crystalline medium;
the steps of:
   subjecting the medium to an AC electric field having a frequency of about 100 Hertz;
   impinging a beam of constant frequency radiant energy onto the medium over an area of the medium which is to store a hologram;
   impinging an information-carrying light beam of radiant energy onto said receiving area of said medium; and
   keeping the energy intensities of said beams of radiant energy to a ratio of not greater than 1:1000.

6. In the method set forth in claim 5, further including: selecting said medium to be bismuth silicon oxide.

7. An article including a hologram induced by the method steps set forth in claim 5.

8. In a method of recording a hologram in an electro optic crystalline record medium having a radiant-energy receiving surface for receiving hologram-inducing, radiant-energy beams;
including the steps of:
   inducing in said medium, at least in a portion of the medium which is to store a hologram, an electric field varying at a frequency of not greater than about 100 Hertz; and
   impinging a plurality of substantially identical light intensity hologram inducing radiant-energy beams onto said receiving surface.

9. An article having a hologram induced therein using the method steps of claim 8.

10. In data storage apparatus, including, in combination:
   a photorefractive crystal having a 110 axis;
   low-frequency bias means connected to said crystal for inducing a low-frequency bias field of about 100 Hertz in the crystal along said 110 axis;
   light means optically coupled to said crystal for emitting a light beam to be intercepted by the crystal, said light beams supplying two light beams of substantially equal light intensities to said crystal; and
   modulation means operatively coupled to the light means for activating the light means to modulate light intensity thereof to impose information on the light beam to be stored in said crystal.

* * * * *